(12) United States Patent
Kim et al.

(10) Patent No.: US 9,340,759 B2
(45) Date of Patent: May 17, 2016

(54) CLEANING COMPOSITION AND METHOD OF MANUFACTURING METAL WIRING USING THE SAME

(71) Applicants: Samsung Display Co., Ltd., Yongin, Gyeonggi-Do (KR); Cowon Innotech Inc., Pyeongtaek-si, Gyeonggi-do (KR)

(72) Inventors: Bong-Yeon Kim, Yongin (KR); Jin-Ho Ju, Yongin (KR); Jun-Hyuk Woo, Yongin (KR); Jung-Hwan Song, Pyeongtaek-si (KR); Seok-Ho Lee, Pyeongtaek-si (KR); Seong-Sik Jeon, Pyeongtaek-si (KR); Jong-Su Han, Pyeongtaek-si (KR)

(73) Assignees: SAMSUNG DISPLAY CO., LTD. (KR); LTCAM CO., LTD. (KR)

( * ) Notice: Subject to any disclaimer, the term of this patent is extended or adjusted under 35 U.S.C. 154(b) by 0 days.

(21) Appl. No.: 14/264,193

(22) Filed: Apr. 29, 2014

(65) Prior Publication Data

US 2015/0136728 A1    May 21, 2015

(30) Foreign Application Priority Data

Nov. 15, 2013    (KR) .......................... 10-2013-0139327

(51) Int. Cl.
| | |
|---|---|
| C09K 13/04 | (2006.01) |
| C11D 11/00 | (2006.01) |
| H01L 21/02 | (2006.01) |
| H05K 3/26 | (2006.01) |
| C11D 7/32 | (2006.01) |
| C11D 7/26 | (2006.01) |
| C11D 7/08 | (2006.01) |

(Continued)

(52) U.S. Cl.
CPC .............. *C11D 11/0047* (2013.01); *C11D 7/06* (2013.01); *C11D 7/08* (2013.01); *C11D 7/265* (2013.01); *C11D 7/3245* (2013.01); *H01L 21/02068* (2013.01); *H05K 3/26* (2013.01); *H05K 1/0306* (2013.01); *H05K 3/064* (2013.01); *H05K 3/388* (2013.01); *H05K 2201/0317* (2013.01); *H05K 2201/0341* (2013.01); *H05K 2203/124* (2013.01); *H05K 2203/125* (2013.01)

(58) Field of Classification Search
CPC .............. C09G 1/02; C09G 1/00; C23F 1/14; C23F 1/16; C23F 1/18; C23F 1/30; C23F 1/32; H01L 21/02068; H01L 21/321; H01L 21/02057; H05K 2201/0341; H05K 2203/124
USPC ........ 252/79.1, 79.2, 79.3, 79.4; 134/1.1, 1.2, 134/1.3, 1.4; 438/745, 754
See application file for complete search history.

(56) References Cited

U.S. PATENT DOCUMENTS

| | | | |
|---|---|---|---|
| 5,648,324 A * | 7/1997 | Honda et al. .................. | 510/176 |
| 6,399,552 B1 | 6/2002 | Lee et al. | |

(Continued)

FOREIGN PATENT DOCUMENTS

| | | |
|---|---|---|
| JP | 2006-295118 A | 10/2006 |
| KR | 1020000073897 A | 12/1999 |

(Continued)

*Primary Examiner* — Lan Vinh
(74) *Attorney, Agent, or Firm* — Cantor Colburn LLP

(57) ABSTRACT

A cleaning composition includes about 0.01 to about 5 wt % of a chelating agent; about 0.01 to about 0.5 wt % of an organic acid; about 0.01 to about 1.0 wt % of an inorganic acid; about 0.01 to about 5 wt % of an alkali compound; and deionized water.

18 Claims, 6 Drawing Sheets

| DIVISION | DIW | T-0.4% | COMPOSITION 1 | COMPOSITION 2 |
|---|---|---|---|---|
| BEFORE CLEANING SURFACE TREATMENT | | | | |
| NUMBER OF PARTICLES | 493 | 672 | 548 | 614 |
| AFTER CLEANING SURFACE TREATMENT | | | | |
| NUMBER OF PARTICLES | 428 | 422 | 180 | 111 |
| REMOVAL RATE (%) | 13.1% REMOVED | 37.2% REMOVED | 67.1% REMOVED | 81.9% REMOVED |

(51) Int. Cl.
*C11D 7/06* (2006.01)
*H05K 3/06* (2006.01)
*H05K 1/03* (2006.01)
*H05K 3/38* (2006.01)

(56) References Cited

U.S. PATENT DOCUMENTS

| | | | |
|---|---|---|---|
| 6,660,700 B2 | 12/2003 | Wojtczak et al. | |
| 7,104,267 B2 | 9/2006 | Emami et al. | |
| 7,247,208 B2 | 7/2007 | Hsu | |
| 7,393,819 B2 | 7/2008 | Hsu | |
| 7,435,712 B2 | 10/2008 | Misra et al. | |
| 7,718,591 B2 | 5/2010 | Hsu | |
| 2003/0158059 A1 | 8/2003 | Sakai et al. | |
| 2009/0130849 A1* | 5/2009 | Lee | 438/693 |
| 2009/0289217 A1* | 11/2009 | Sato | C09G 1/02 252/79.4 |
| 2010/0035433 A1* | 2/2010 | Takemiya et al. | 438/693 |
| 2010/0081279 A1* | 4/2010 | Palmer et al. | 438/667 |

FOREIGN PATENT DOCUMENTS

| | | |
|---|---|---|
| KR | 1020030049121 A | 6/2003 |
| KR | 1020100040004 A | 4/2010 |
| KR | 101243847 B | 3/2013 |

* cited by examiner

| | DIW | TMAH 0.4wt% | CLEANING SOLUTION (ORIGINAL SOLUTION) | CLEANER (10-FOLD DILUTION) |
|---|---|---|---|---|
| 5 min |  |  |  |  |
| 30 min |  |  |  |  |
| 60 min |  |  |  |  |
| 120 min |  |  |  |  |

| DIVISION | DIW | TMAH 0.4wt% | COMPOSITION 1 | COMPOSITION 2 |
|---|---|---|---|---|
| BEFORE CLEANING SURFACE TREATMENT |  |  |  |  |
| NUMBER OF PARTICLES | 260 | 200 | 270 | 848 |
| AFTER CLEANING SURFACE TREATMENT |  |  |  |  |
| NUMBER OF PARTICLES | 370 | 120 | 94 | 268 |
| REMOVAL RATE (%) | 136% INCREASED | 40.0% REMOVED | 65.2% REMOVED | 68.3% REMOVED |

FIG. 7

| DIVISION | DIW | T-0.4% | COMPOSITION 1 | COMPOSITION 2 |
|---|---|---|---|---|
| BEFORE CLEANING SURFACE TREATMENT | | | | |
| NUMBER OF PARTICLES | 493 | 672 | 548 | 614 |
| AFTER CLEANING SURFACE TREATMENT | | | | |
| NUMBER OF PARTICLES | 428 | 422 | 180 | 111 |
| REMOVAL RATE (%) | 13.1% REMOVED | 37.2% REMOVED | 67.1% REMOVED | 81.9% REMOVED |

CLEANING COMPOSITION AND METHOD OF MANUFACTURING METAL WIRING USING THE SAME

This application claims priority to Korean Patent Application No. 10-2013-0139327, filed on Nov. 15, 2013, and all the benefits accruing therefrom under 35 U.S.C. §119, the content of which in its entirety is herein incorporated by reference.

BACKGROUND

1. Field

One or more embodiments of the present invention relate to a cleaning composition for manufacturing a semiconductor and a display.

2. Description of the Related Art

In the rapid development of information technology, a large scale integrated circuit (e.g. large scale integration ("LSI"), ultra large scale integration ("ULSI"), and very ultra large scale integration ("VLSI") circuits), is miniaturized, highly densified, and highly integrated. Technology has been developed to form a large scale integrated circuit on a metal wiring with a multi-layer structure. In order to achieve the multi-layer structure, a pitch width of the metal wiring and a capacitance of the metal wiring need to be reduced. In this regard, copper (Cu) having low resistivity has been used as a metal wiring material.

SUMMARY

One or more exemplary embodiments of the present invention include a cleaning composition and a method of manufacturing a metal wiring using the cleaning composition. The cleaning process improves reliability of a semiconductor apparatus by removing contaminants such as particles, metal atoms and organic materials that are generated during the manufacturing process.

According to one or more exemplary embodiments, there is provided a cleaning composition including about 0.01 to about 5 weight percent (wt %) of a chelating agent, where the chelatin agent includes an amino acid compound; about 0.01 to about 5 wt % of an organic acid; about 0.01 to about 1 wt % of an inorganic acid; and about 0.01 to about 5 wt % of an alkali compound; and deionized water.

The chelating agent includes at least one of glycine, ethylenediaminetetraacetic acid, and cyclohexanediaminetetraacetic acid.

The organic acid includes at least one of lactic acid, lactic acid alkyl ester, acetic acid, and acetic acid alkyl ester.

The inorganic acid includes at least one of hydrochloric acid, phosphoric acid, nitric acid, sulfuric acid, hydrofluoric acid, bromic acid, and iodic acid.

The alkali compound includes at least one of tetramethylammonium hydroxide, tetrabutylammonium hydroxide, tetraethylammonium hydroxide, and trimethylammonium chloride.

The cleaning composition has a pH of about 1 to about 6, or a pH of about 8 to about 13.

The cleaning composition further includes about 0.01 to about 3 wt % of a corrosion inhibitor.

The corrosion inhibitor includes a benzene carboxylic acid-based material or a benzotriazole-based material.

According to one or more exemplary embodiments, there is provided a cleaning composition including about 0.1 to about 3 wt % of a corrosion inhibitor; about 0.01 to about 0.5 wt % of an organic acid; about 0.01 to about 1.0 wt % of an inorganic acid; about 0.01 to about 5 wt % of an alkali compound; and deionized water.

The corrosion inhibitor includes a benzene carboxylic acid-based material or a benzotriazole-based material.

The benzotriazole-based material includes at least one of 6-chloro-1-methoxy-benzotriazole, 2,2'-[(1H-benzotriazol-1-ylmethyl)imino]bisethanol, 1H-thiazolo[4,5-d]-1,2,3-triazole, and 5-methyl-9Cl.

According to one or more exemplary embodiments, there is provided a method of manufacturing a metal wiring, the method including: forming a first conductive layer on a substrate, forming a second conductive layer on the first conductive layer, cleaning the second conductive layer using a cleaning composition, forming a photoresist layer pattern on the second conductive layer, and etching the first conductive layer and the second conductive layer, where the cleaning composition includes about 0.01 to about 5 wt % of a chelating agent, where the chelating agent includes an amino acid compound, about 0.01 to about 0.5 wt % of an organic acid, about 0.01 to about 1.0 wt % of an inorganic acid, 0.01 to about 5 wt % of an alkali compound, and deionized water.

The amino acid-based chelating agent includes at least one of glycine, ethylenediaminetetraacetic acid, and cyclohexanediaminetetraacetic acid.

The organic acid includes at least one of lactic acid, lactic acid alkyl ester, acetic acid, and acetic acid alkyl ester.

The inorganic acid includes at least one of hydrochloric acid, phosphoric acid, nitric acid, sulfuric acid, hydrofluoric acid, bromic acid, and iodic acid.

The alkali compound includes at least one of tetramethylammonium hydroxide, tetrabutylammonium hydroxide, tetraethylammonium hydroxide, and trimethylammonium chloride.

The cleaning composition further includes about 0.01 to about 3 wt % of a corrosion inhibitor.

The corrosion inhibitor includes a benzene carboxylic acid-based material or a benzotriazole-based material.

The substrate is formed of glass, the first conductive layer is formed of titanium (Ti), and the second conductive layer is formed of copper (Cu).

BRIEF DESCRIPTION OF THE DRAWINGS

These and/or other advantages and features of this disclosure will become more apparent by describing in further detail exemplary embodiments thereof with reference to the drawings, in which:

FIG. 7 is a SEM image showing changes on a Cu surface when oil is spread on a substrate in accordance with Example 8;

DETAILED DESCRIPTION

Figure 1:
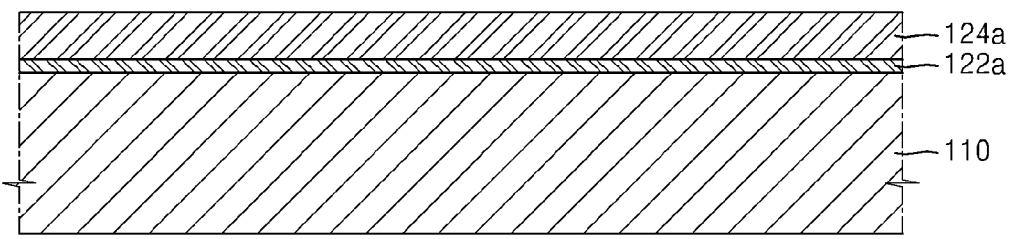
FIGS. 1 to 4 are cross-sectional views illustrating exemplary embodiments of a method of forming a gate electrode using an exemplary cleaning composition.

The invention will now be described more fully hereinafter with reference to the accompanying drawings, in which various embodiments are shown. In this regard, the invention may be embodied in many different forms and should not be construed as being limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting of the invention. It will be further understood that the terms "includes," "including," "comprises" and "comprising" when used in this specification, specify the presence of stated features, integers, steps, operations, elements, and/or components, but do not preclude the presence or addition of one or more other features, integers, steps, operations, elements, components, and/or groups thereof.

As used herein, the terms "about" or "approximately" are inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

As used herein, the terms "about" or "approximately" are inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value It will be understood that when an element or layer is referred to as being "on" another element or layer, the element or layer can be directly on another element or layer, or intervening elements or layers may be present therebetween. In contrast, when an element is referred to as being "directly on" another element or layer, there are no intervening elements or layers present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, one or more exemplary embodiments will now be described more fully with reference to the accompanying drawings.

FIGS. 1 to 4 are cross-sectional diagrams showing an exemplary method of forming a gate electrode using an exemplary cleaning composition.

Referring to FIG. 1, a first conductive layer 122*a* is formed on a substrate 110. The substrate 110 may be formed of glass, but is not limited thereto.

The first conductive layer 122*a* may include at least one of molybdenum (Mo), a Mo alloy, chromium (Cr), a Cr alloy, titanium (Ti), a Ti alloy, tantalum (Ta), a Ta alloy, manganese (Mn) and a Mn alloy.

A second conductive layer 124*a* is formed on the first conductive layer 122*a*.

The second conductive layer 124*a* may include at least one of aluminum (Al, an Al alloy, silver (Ag), a Ag alloy, copper (Cu) and a Cu alloy. In some exemplary embodiments, the second conductive layer 124*a* includes Cu or a Cu alloy in order to implement a low resistance wiring.

Figure 2:
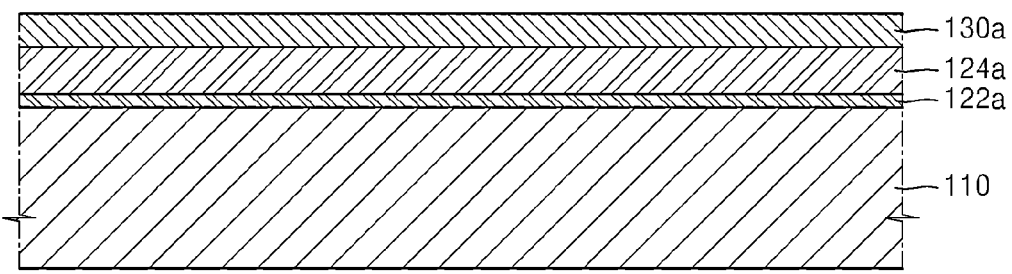

Referring to FIG. 2, a photoresist layer 130*a* is formed on the second conductive layer 124*a*.

Figure 3:
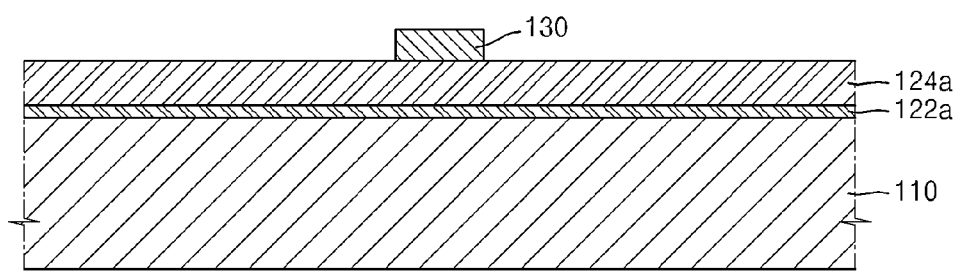

Referring to FIG. 3, the photoresist layer 130*a* is patterned so as to form a photoresist layer pattern 130.

Figure 4:
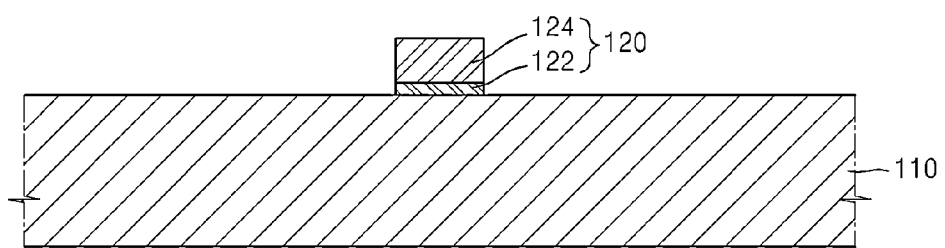

FIG. 4 is a cross-section of an exemplary embodiment of a gate electrode 120 in the shape of a bi-layer. However, the shape of the gate electrode 120 is not limited thereto, and the gate electrode 120 may be disposed in the shape of a single layer or a triple-layer. In the case of the triple-layer, layers having different physical properties may be disposed in combination.

Referring to FIG. 4, a metal wiring such as a gate electrode 120 consisting of a first conductive pattern 122 and a second conductive pattern 124 is formed by masking the photoresist pattern 130 and etching the first conductive layer 122a and the second conductive layer 124a.

Next, a cleaning process is performed using a cleaning composition that will be described later.

A cleaning process is carried out in order to improve reliability of a semiconductor apparatus by removing contaminants such as particles, metal atoms, and organic materials that are generated during a manufacturing process. Through the cleaning process, particles and organic contaminants may be removed, and corrosion on the Cu surface and re-adsorption of the removed contaminants may be prevented. In addition, the cleaning process for the semiconductor apparatus may include any method including spraying or dipping using the cleaning composition, without exception.

So far, the cleaning process performed using the cleaning composition, and the formation of the gate electrode 120 are described, but are not limited thereto.

In exemplary embodiments, the cleaning composition may include an amino acid-based chelating agent, an organic acid, an inorganic acid, an alkali compound, and deionized ("DI") water.

In an exemplary embodiment, the cleaning composition may include about 0.01 to about 5 wt % of an amino acid-based chelating agent, about 0.01 to about 0.5 wt % of an organic acid, about 0.01 to about 1.0 wt % of an inorganic acid, about 0.01 to about 5 wt % of an alkali compound, and about 0.01 to about 98 wt % of DI Water.

(A) Amino Acid-Based Chelating Agent

The amino acid-based chelating agent may perform the function of removing residues on the surface of the metal wiring and preventing re-adsorption of the residues. The amino acid-based chelating agent may be present in a range from about 0.01 to about 5 wt % with respect to the cleaning composition.

In exemplary embodiments, the amino acid-based chelating agent includes at least one of acetylglycine (Ac-glycine), glycine, glycine-13C, glycine-2,2-d2, glycine-N,N,O-d3, glycine-d5, L-glycine, N-glycine, Z-glycine, Z-glycine amide, glycine anhydride, glycine benzyl ester, glycine-1-13C, glycine-2-13C, glycine citrate, glycine cobalt salt, glycine cresol red, glycine ethyl ester, glycine-d2-N-Fmoc, glycine fumarate, *glycine max*, glycine-1-13C-15N, glycine-13C2-15N, glycine-15N, glycine phosphate, glycine sodium salt, glycine sulfate, glycine thymol blue, glycine xylidide-d, glycine xylidine, glycine zinc salt, boc-glycine, DNP-glycine, glycerine, glycinamide, glycinates, glycitin, glycon, glycosamine, glycosine, MTH-glycine, polyglycine, PTH-glycine, TNP-glycine, triglycine, ethylenediamine-N,N,N',N'-tetraacetic acid-13C4, ethylenediaminetetraacetic acid-d1, ethylenediaminetetraacetic acid-d4, ethylenediaminetetraacetic-d12 acid, ethylenediaminetetraacetic acid ammonium salt, ethylenediamine-N,N,N',N'-tetraacetic acid calcium, ethylenediaminetetraacetic acid calcium disodium salt, ethylenediaminetetraacetic acid copper disodium salt, ethylenediaminetetraacetic acid diammonium copper salt solution, ethylenediaminetetraacetic acid copper diammonium salt, ethylenediaminetetraacetic acid diammonium salt hydrate, ethylenediaminetetraacetic acid dicalcium salt, ethylenediaminetetraacetic acid dilithium salt, ethylenediaminetetraacetic acid dilithium salt hydrate, ethylenediaminetetraacetic acid dipotassium magnesium salt, ethylenediaminetetraacetic acid dipotassium salt, ethylenediaminetetraacetic acid dipotassium salt dihydrate, ethylenediaminetetraacetic acid disodium barium salt, ethylenediaminetetraacetic acid calcium trisodium salt, ethylenediaminetetraacetic acid disodium cobalt salt, ethylenediaminetetraacetic acid disodium lead salt, ethylenediaminetetraacetic acid disodium magnesium salt, ethylenediaminetetraacetic acid disodium manganese salt, ethylenediaminetetraacetic acid disodium nickel salt, ethylenediaminetetraacetic acid disodium salt, ethylenediaminetetraacetic acid disodium salt 2-hydrate, ethylenediaminetetraacetic acid disodium salt solution, ethylenediaminetetraacetic acid disodium zinc salt, ethylenediaminetetraacetic acid, ethylenediaminetetraacetic acid iron III ammonium salt, ethylenediaminetetraacetic acid iron III potassium salt, ethylenediaminetetraacetic acid iron III sodium salt, ethylenediaminetetraacetic acid iron III sodium salt 3-hydrate, ethylenediaminetetraacetic acid iron III sodium salt hydrate, ethylenediaminetetraacetic acid magnesium disodium salt, ethylenediamine tetraacetic acid manganese salt, ethylenediamine-N,N,N',N'-tetraacetic acid monoanhydride, ethylenediaminetetraacetic acid monosodium bismuth salt, ethylenediamine-N,N,N',N'-tetraacetic acid tetraaspartic acid octa[amido[N-2-aminoethyl maleimide]], ethylenediamine-N,N,N',N'-tetraacetic acid tetrakis[N-2-aminoethyl maleimide], ethylenediaminetetraacetic acid tetramethyl ester, ethylenediaminetetraacetic acid tetramethyl ester sulfate, ethylenediaminetetraacetic acid tetrapotassium salt, ethylenediaminetetraacetic acid tetra sodium salt, ethylenediaminetetraacetic acid tetrasodium salt 2-hydrate, ethylenediaminetetraacetic acid tetrasodium salt 4-hydrate, ethylenediaminetetraacetic acid tetrasodium salt hydrate, ethylenediaminetetraacetic acid triethyl ester hydrochloride, ethylenediaminetetraacetic acid tripotassium salt, ethylenediaminetetraacetic acid tripotassium salt 2-hydrate, ethylenediaminetetraacetic acid trisodium salt, ethylenediamine tetraacetic acid trisodium salt 1-hydrate, ethylenediaminetetraacetic acid trisodium salt 3-hydrate, ethylenediaminetetraacetic acid zinc disodium salt hydrate, ethylenediaminetetraacetic acid zinc disodium salt, ethylenediaminetetraacetic dianhydride, 1,2-cyclohexanediaminetetraacetic acid, trans-1,2-cyclohexanediaminetetraacetic acid, trans-1,2-cyclohexanediaminetetraacetic acid 1-hydrate, 1,2-diaminopropane-N,N,N',N'-tetraacetic acid, diethylaminoacetic acid, diethylenetriaminepentaacetic dianhydride, ethanediylidenetetrathio tetraacetic acid, ethylendiamin tetra (methylenphosphonic acid), ethylenediamine diacetate, ethylenediamine diacetate, ethylenediaminetetraacetonitrile, ethylenediaminetetrapropionic acid, hexamethylene diamine tetramethylene phosphonic acid, hexamethylenediaminetetra (methylenephosphonic acid), iron (III) ethylenediaminetetraacetate, methoxyimino-acetic acid, 2-methylacetoacetic acid, 2-methylbenzoyl aminoacetic acid, methylene disalicylic acid, methyliminodiacetic acid, phenylaminoacetic acid, o-phenylenediacetic acid, p-phenylenediacetic acid, N,N,N',N'-1,4-phenylenediaminetetraacetic acid, 1,3-propylenediamine pentaacetic acid, 1,3-propylenediamine-N,N,N',N'-tetraacetic acid, propylenediamintetraacetic acid, thymine-1-acetic acid, 1-benzylideneamino parabanic acid, 2-diethylaminomethyl acrylic acid, 4-diethylaminosalicylic acid, dimethyldianilinterephthalic acid, ethylene-d4-diamine-1-N-tert-Boc, tris-ethylenediamine cobalt trichloride, ethylenediamine dihydrochloride, ethylenediamine hydrobromide, ethylenediamine hydrochloride, ethylenediamine palladium II chloride, ethylenediamine di-1-(+)-tartrate, 4-methylamino butyric acid, 2-methylamino ethanesulfonic acid, methyl beta-neuraminic acid, 12-methyltetradecanoic acid, 13-methyltetradecanoic acid, m-phenylenediamine-4-sulfonic acid, p-phenylenediamine-2-sulfonic acid, p-phenylenediamine-o-sulfonic acid, and pyrazinetetracarboxylic acid. These examples may be used alone or in combination, but are not limited thereto.

(B) Organic Acid

The organic acid may perform the function of maintaining the cleaning composition in a buffer state so as to secure performance stability of the cleaning composition. The organic acid may be present in a range from about 0.01 to about 0.5 wt % with respect to the total weight of the cleaning composition.

In exemplary embodiments, the organic acid includes at least one of lactic acid, (+/−)-lactic acid, D-(−)-lactic acid, DL-lactic acid, L-(+)-lactic acid, S-(−)-lactic acid benzyl ester, D-lactic acid-benzyl ester, lactic acid n-butyl ester, L-lactic acid calcium salt, lactic acid dodecyl ester, L-(−)-lactic acid ethyl ester, lactic acid ethyl ester, L-(+)-lactic acid hemizinc salt, lactic acid isoamyl ester, R-(+)-lactic acid isobutyl ester, D-(−)-lactic acid lithium salt, DL-lactic acid lithium salt, L-(+)-lactic acid lithium salt, L-lactic acid lithium salt, lithium salt, L-lactic acid magnesium salt 3-hydrate, lactic acid menthyl ester, D-(+)-lactic acid methyl ester, lactic acid methyl ester, L-lactic acid potassium salt, L-(+)-lactic acid silver salt, DL-lactic acid-14C sodium salt, D-lactic acid sodium salt, L-(+)-lactic acid sodium salt, DL-lactic acid sodium salt, L-(+)-lactic acid solution, acetic acid, acetic acid-d4, acetic acid-1-13C, acetic acid-13C2, acetic acid-18O2, acetic acid-2,2,2-d3, acetic acid-2-13C,2,2,2-d3, acetic acid-d1, aluminum sodium salt, acetic acid aminooxo methyl ester, ammonium copper salt, ammonium zinc salt, acetic acid n-amyl ester, acetic-1,2-13C2 acid 1,1'-anhydride, acetic-1-14C acid, 1,1'-anhydride, 3-acetic acid benzeneboronic acid, 4-acetic acid-benzeneboronic acid, acetic acid bromo diphenylmethyl ester, acetic acid 2-bromoethyl ester, acetic acid 3-buten-1-yl ester, acetic acid 3-buten-2-yl ester, acetic acid trans-2-butenyl ester, acetic acid 2-tert-butylcyclohexyl ester, acetic acid n-butyl ester, acetic acid tert-butyl ester, acetic acid 4-tert-butylphenyl ester, acetic acid 2-butynyl ester, acetic acid-2-13C, acetic acid 2-chloroethyl ester, acetic acid 6-chloro-1H-indol-3-yl ester, acetic acid cinnamyl ester, acetic acid 1-cyano-2-propenyl ester, acetic acid 1-cyanovinyl ester, acetic acid cyclohexyl ester, acetic acid cyclohexylethyl ester, acetic-d3 acid-D1, acetic acid 9-decen-1-yl ester, acetic acid trans-2-decen-1-yl ester, acetic acid n-decyl ester, acetic acid diethoxymethyl ester, acetic acid 2-dimethylaminoethyl ester, acetic acid 2,5-dimethylphenyl ester, acetic acid n-dodecyl ester, acetic acid 2-ethylbutyl ester, acetic acid ethyl ester, acetic acid 2-ethylhexyl ester, acetic acid 2-ethylphenyl ester, acetic acid 4-ethylphenyl ester, acetic acid formyl ester, acetic acid 5-formyl-2-furylmethylester, acetic acid geranyl ester, acetic acid glacia, acetic acid trans-2-hepten-1-yl ester, acetic acid n-heptyl ester, acetic acid 5-hexen-1-yl ester, acetic acid cis-3-hexen-1-yl ester, acetic acid trans-2-hexen-1-yl ester, acetic acid n-hexyl ester, acetic acid 2-hydroxyethyl ester, acetic acid N-hydroxysuccinimide ester, N-acetic acid-indole-3-carboxaldehyde, acetic acid 4-iodo-butyl ester, acetic acid isoamyl ester, acetic acid isobornyl ester, acetic acid isobutyl ester, acetic acid isopropenyl ester, acetic acid 4-isopropylbenzyl ester, acetic acid isopropyl ester, acetic acid isopropylidene-hydrazide, acetic acid lavandulyl ester, acetic acid 4-methoxybenzyl ester, acetic acid 3-methoxybutyl ester, acetic acid 3-methoxy-3-methylbutyl ester, acetic acid 2-methoxyphenyl ester, acetic acid methoxypropyl ester, acetic acid 4-methylbenzyl ester, acetic acid 2-methylbutyl ester, acetic acid 2-methylcyclohexyl ester, acetic acid cis-4-methylcyclohexyl ester, acetic acid trans-3-methylcyclohexyl ester, acetic acid 4-methylcyclohexylmethyl ester, acetic acid methyl ester, acetic acid 3-methylhexyl ester, acetic acid 1-methyl-2-oxopropyl ester, acetic acid 2-methyl-4-penten-2-yl ester, acetic acid 2-methylpentyl ester, acetic acid 3-methylpentyl ester, acetic acid 4-methyl-2-pentyl ester, acetic acid methylthiomethyl ester, acetic acid 4-methylumbelliferyl ester, acetic acid monoglyceride, acetic acid 4-nitrobenzyl ester, acetic acid 2-nitrophenyl ester, acetic acid 4-nitrophenyl ester, acetic acid p-nitrophenylhydrazide, acetic acid 8-nonen-1-yl ester, acetic acid cis-6-nonen-1-yl ester, acetic acid 2-nonyl ester, acetic acid n-nonyl ester, acetic acid n-octadecyl ester, acetic acid 7-octen-1-yl ester, acetic acid n-octyl ester, acetic acid oleyl ester, acetic acid 2-oxo-cyclohex-3-enyl ester, acetic acid 6-oxo-cyclohex-1-enyl ester, acetic acid 4-oxo-cyclohexyl ester, acetic acid 2-oxo-propyl ester, acetic acid 4-penten-1-yl ester, acetic acid 2-phenoxyethyl ester, acetic acid phenyl ester, acetic acid 1-phenylethyl ester, acetic acid 2-phenylethyl ester, acetic acid propargyl ester, acetic acid 2-propionylphenyl ester, acetic acid n-propyl ester, 3-acetic acid pyridine hydrochloride, acetic acid pyridinyl salt, acetic-d3 acid sodium salt, [1-14C]acetic acid sodium salt, acetic acid solution, acetic acid m-tolyl ester, acetic acid o-tolyl ester, acetic acid p-tolyl ester, acetic acid 1-p-tolyl-ethyl ester, acetic acid n-tridecyl ester, acetic acid 3,5,5-trimethylhexyl ester, acetic acid vinyl ester, acetic acid 2-vinylphenyl ester, and acetic acid 4-vinylphenyl ester. These examples may be used alone or in combination, but are not limited thereto.

(C) Inorganic Acid

The inorganic acid may perform the functions of removing metallic contaminants attached via chemical bonds and adjusting a pH of the cleaning composition. The inorganic acid may be present in a range from about 0.01 to about 1.0 wt % with respect to the total weight of the cleaning composition.

In exemplary embodiments, the inorganic acid includes at least one of hydrochloric acid, phosphoric acid, nitric acid, sulfuric acid, hydrofluoric acid, bromic acid, and iodic acid. These examples may be used alone or in combination, but are not limited thereto.

(D) Alkali Compound

The alkali compound may perform the function of removing particles and organic or inorganic contaminants on a metal surface. In an exemplary embodiment, the alkali compound may remove surface residues such as an oxidation polymer, an organometallic compound, and a metallic compound.

The alkali compound may be present in a range from about 0.01 to about 5 wt % with respect to the total weight of the cleaning composition.

In exemplary embodiments, the alkali compound includes at least one of tetramethylammonium hydroxide ("TMAH"), tetramethylammonium acetate, tetramethylammonium benzoate, tetramethylammonium bicarbonate, tetramethylammonium bisulfate 1-hydrate, tetramethylammonium borohydride, tetramethylammonium bromide, tetramethylammonium chloride, tetramethylammonium fluoride, tetramethylammonium fluoride 3-hydrate, tetramethylammonium fluoride 4-hydrate, tetramethylammonium formate, tetramethylammonium formate solution, tetramethylammonium[alpha-(beta-D-glucopyranosyl)phenethylideneaminyl]sulfate, tetramethylammonium hexafluorophosphate, tetramethylammonium hydrogen phthalate, tetramethylammonium hydrogensulfate, tetramethylammonium hydrogensulfate hydrate, tetramethylammonium hydroxide, tetramethylammonium hydroxide 5-hydrate, tetramethylammonium hydroxide solution, tetramethylammonium (1-hydroxyethylidene)pentacarbonylchromium, tetramethylammonium[4-hydroxy-alpha-(1-thio-beta-D-glucopyranosyl)phenethylideneaminyl]sulfate, tetramethylammonium iodide, tetramethylammonium methyl sulfate, tetramethylammonium nitrate, tetramethylammonium octahydrotriborate, tetramethylammonium perchlorate, tetramethylammonium phosphate, tetramethylammonium silicate, tetramethylammonium silicate solution, tetramethylammonium sulfate, tetramethylammonium tetrafluoroborate, tetramethylammonium tetraphenylborate, tetramethylammonium thioacetate, tetramethylammonium p-toluenesulfonate, tetramethylammonium triacetoxyborohydride, tetramethylammonium tribromide, tetramethylammonium-trifluoromethanolate, benzyltriethylammonium hydroxide, benzyltrimethylammonium methoxide, cetyltrimethylammonium bromide, hexyltrimethylammonium bromide, methylammonium bromide, stearyltrimethylammonium chloride, tetra-n-butylammonium hydroxide, tetrabutylammonium hydroxide, tetrabutylammonium hydroxide 30-hydrate, tetrabutyl 4-hydroxy ammonium hydroxide, tetradecyltrimethylammonium bromide, tetradecyltrimethylammonium chloride, tetraethanol ammonium hydroxide, tetraethylammonium hydroxide, tetraethylammonium hydroxide solution, tetra-n-hexylammonium hydroxide, tetramethyl-d12-ammonium bromide, tetramethyl-d12-ammonium chloride, tetramethyl ammonium hydrogen sulfate, tetra-n-octylammonium hydroxide, tetrapentylammonium hydroxide, tetrapentylammonium hydroxide solution, tetrapropylammonium hydroxide, triethylphenylammonium hydroxide, trimethylammonium bromide, trimethylammonium chloride, trimethylammonium iodide, trimethylsulfonium hydroxide, tetrabutylammonium borohydride, tetrabutylammonium bromide, tetrabutylammonium chloride, tetrabutylammonium hydrogen sulfide, tetrabutylammonium methoxide, tetradecylammonium chloride, tetraethylammonium borohydride, tetraethylammonium bromide, tetraethylammonium chloride, tetraethylammonium cyanide, tetraethylammonium fluoride, tetraethylammonium hydrogen sulfate, tetraethylammonium iodide, tetraethylammonium rhodanide, tetrahexylammonium chloride, tetraoctylammonium chloride, tetrapentylammonium bromide, tetrapentylammonium iodide, tetrapentylammonium rhodanide, and triethylammonium chloride. These examples may be used alone or in combination, but are not limited thereto.

(E) Deionized Water ("DI Water")

The DI water as a component of an aqueous cleaning composition may perform the function of minimizing damage to a metal wiring. The DI water may be present in a range from about 0.01 to about 98 wt % with respect to the total weight of the cleaning composition.

(F) Corrosion Inhibitor

In an exemplary embodiment, the cleaning composition may further include a corrosion inhibitor.

Alternatively, in another embodiment, the cleaning composition may substitute a corrosion inhibitor for the amino acid-based chelating agent.

That is, in an exemplary embodiment the cleaning composition may include about 0.01 to about 3 wt % of a corrosion inhibitor; about 0.01 to about 0.5 wt % of an organic acid, about 0.01 to about 1.0 wt % of an inorganic acid, about 0.01 to about 5 wt % of an alkali compound, and 0.01 to about 98 wt % of DI Water.

The corrosion inhibitor may include at least one of a benzene carboxylic acid-based material or a benzotriazole-based material. However, the corrosion inhibitor is not limited thereto.

In exemplary embodiments, the benzene carboxylic acid-based corrosion inhibitor includes at least one of 5-amino-1,3-benzendicarboxylic acid, 2-amino-1,4-benzenedicarboxylic acid, 3-amino-1,2-benzenedicarboxylic acid, 5-aminobenzene-1,3-dicarboxylic acid, 3-amino-benzenethiophene-2-carboxylic acid, 1-aminobenzene-2,4,5-tricarboxylic acid, 1-aminobenzene-2,4,6-tricarboxylic acid, 1-aminobenzene-3,4,5-tricarboxylic acid, 5-amino-1,2,3-benzenetricarboxylic acid, 2-aminobenzophenone-2'-carboxylic acid, 5-amino-1-benzothiophene-2-carboxylic acid, 4-amino-2-fluorobenzenecarboxylic acid, 4-amino-3-fluorobenzenecarboxylic acid, 4-amino-2-methoxybenzenecarboxylic acid, 5-amino-2-morpholinobenzenecarboxylic acid, 2-(4-aminophenoxy)benzenecarboxylic acid, azobenzene-3,3'-dicarboxylic acid, azobenzene-4,4'-dicarboxylic acid, N-benzanilide-4,4'-dicarboxylic acid, 1,2-benzenedicarboxylic acid, 1,3-benzenedicarboxylic acid, 1,4-benzenedicarboxylic acid, benzene-1,3-dicarboxylic acid diallyl ester, 1,2-benzenedicarboxylic acid didecyl ester, 1,2-benzenedicarboxylic acid dinonyl ester, 1,2-benzenedicarboxylic acid dipentyl ester, benzenehexacarboxylic acid, benzenehexacarboxylic acid hexamethyl ester, benzenepentacarboxylic acid, 1,2,4,5-benzenetetracarboxylic acid, 1,2,4,5-benzenetetracarboxylic acid-d6, benzene-1,2,3,4-tetracarboxylic acid, 1,2,3-benzenetricarboxylic acid, 1,2,4-benzenetricarboxylic acid, 1,3,5-benzene-d3-tricarboxylic acid, 1,3,5-benzenetricarboxylic acid, benzene-1,2,4-tricarboxylic acid, benzene-1,3,5-tricarboxylic acid, 1,2,3-benzenetricarboxylic acid 2-hydrate, 1-benzhydrylazetane-3-carboxylic acid, 1-benzhydrylazetidine-2-carboxylic acid, 1-benzhydrylazetidine-3-carboxylic acid, 1H-benzimidazole-7-carboxylic acid, 1H-benzimidazole-2-carboxylic acid, 1H-benzimidazole-4-carboxylic acid, 1H-benzimidazole-5-carboxylic acid, 1H-benzimidazole-7-carboxylic acid, 2-benzimidazolecarboxylic acid, 5-benzimidazolecarboxylic acid, benzimidazole-5-carboxylic acid, benzimidazole-5,6-dicarboxylic acid, 1,2-benzisothiazole-3-carboxylic acid, 1,2-benzisoxazole-3-carboxylic acid, 1-benzocyclobutenecarboxylic acid, R-1,4-benzodioxan-2-carboxylic acid, 1,4-benzodioxan-2-carboxylic acid, 1,4-benzodioxan-5-carboxylic acid, (R)-1,4-benzodioxane-2-carboxylic acid, (S)-1,4-benzodioxane-2-carboxylic acid, 1,4-benzodioxane-2-carboxylic acid, 1,4-benzodioxane-6-carboxylic acid, 1,3-benzodioxole-2-carboxylic acid, 1,3-benzodioxole-4-carboxylic acid, benzo[1,3]dioxole-2-carboxylic acid, 1-benzofuran-3-carboxylic acid, 1-benzofuran-5-carboxylic acid, 2,3-benzofuran-2-carboxylic acid, 2-benzofurancarboxylic acid, benzo b furan-2-carboxylic acid, benzofuran-2-carboxylic acid, benzofuran-3-carboxylic acid, benzofuran-4-carboxylic acid, benzofuran-6-carboxylic acid, benzofuran-7-carboxylic acid, 2,3-benzofurandicarboxylic acid, benzofurazan-5-carboxylic acid, benzofuroxan-5-carboxylic acid, 3H-benzo[e]indole-2-carboxylic acid, benzo[d]isoxazole-3-carboxylic acid, benzo[d]oxazole-6-carboxylic acid, benzooxazole-2-carboxylic acid, benzophenone-2-carboxylic acid, benzophenone-4,4'-dicarboxylic acid, 3,3',4,4'-benzophenonetetracarboxylic acid, benzophenone tetracarboxylic acid, benzophenone-3,3',4,4'-tetracarboxylic acid, benzo[b]tellurophene-2-carboxylic acid, 1,2,3-benzothiazole-5-carboxylic acid, 1,3-benzothiazole-6-carboxylic acid, benzo[d]thiazole-7-carboxylic acid, benzothiazole-2-carboxylic acid, benzothiazole-5-carboxylic acid, benzothiazole-6-carboxylic acid, 1-benzothiophene-3-carboxylic acid, 1-benzothiophene-5-carboxylic acid, benzo[b]thiophene-2-carboxylic acid, benzo[b]thiophene-3-carboxylic acid, benzo[b]thiophene-7-carboxylic acid, benzothiophene-2-carboxylic acid, 1H-benzotriazole-5-carboxylic acid, benzotriazole-4-carboxylic acid, 5-benzoxazolecarboxylic acid, 3-benzoylamino-2-thiophenecarboxylic acid, 1-benzoyl-3-azetidinecarboxylic acid, 2-benzoylcyclohexanecarboxylic acid, cis-2-benzoylcyclohexane-1-carboxylic acid, 2-benzoyl-1H-indole-3-carboxylic acid, 1-benzoylpiperidine-2-carboxylic acid, 1-benzoylpiperidine-4-carboxylic acid, 2-benzoyl-3-pyridinecarboxylic acid, 3-benzoylpyridine-2-carboxylic acid, 1-benzoylpyrrolidine-2-carboxylic acid, 3-benzoyl-4-quinolinecarboxylic acid, 3-benzoylquinoline-4-carboxylic acid, 3-benzoyl-2-thiophenecarboxylic acid, 1-Benzyl-azetidine-2-carboxylic acid, 1-benzyl-2-azetidinecarboxylic acid, 1-benzyl-azetidine-3-carboxylic acid, 1-benzylazetidine-2-carboxylic acid amide, 1-benzyl-4-boc-piperazine-2-carboxylic acid, 1-benzylcyclobutane-1-carboxylic acid, 1-benzylcyclobutanecarboxylic acid, 1-benzylcyclohexanecarboxylic acid, 1-benzylcyclopentanecarboxylic acid, 1-benzylcyclopropanecarboxylic acid, 1-benzyl-1H-indazole-3-carboxylic acid, 1-benzyl indazolyl-3-carboxylic acid, 1-benzylindole-3-carboxylic acid, 2-benzylisoindoline-4-carboxylic acid, 4-benzyl-morpholine-2-carboxylic acid, 4-benzyl-morpholine-3-carboxylic acid, 4-benzylmorpholine-3-carboxylic acid, 3-benzyl-2-oxazolidinecarboxylic acid, 3-benzyloxy-cyclobutanecarboxylic acid, 4-benzyloxyindole-2-carboxylic acid, 5-benzyloxy-2-indolecarboxylic acid, 5-benzyloxyindole-2-carboxylic acid, 6-benzyloxy-1H-indole-2-carboxylic acid, 6-benzyloxy-1H-indole-3-carboxylic acid, 7-benzyloxy-1H-indole-3-carboxylic acid, 6-benzyloxy pyridine-2-carboxylic acid, 8-benzyloxy quinoline-7-carboxylic acid, R-4-benzyl piperazine-2-carboxylic acid, 1-benzyl-1,3-piperazinedicarboxylic acid, 1-benzyl-2-piperidinecarboxylic acid, 1-benzylpiperidine-3-carboxylic acid, 1-benzylpiperidine-4-carboxylic acid, 1-benzyl-pyrrolidine-3-carboxylic acid, N-benzyl-3-pyrrolidinecarboxylic acid, 2-benzylsulfanyl benzenecarboxylic acid, 2-benzyl-thiazolidine-4-carboxylic acid, 2-biphenylcarboxylic acid, 5-bromobenzenecarboxylic acid, 4-bromo-1,3-benzenedicarboxylic acid, 4-bromobenzene-1,2-dicarboxylic acid, 5-bromo-1,3-benzenedicarboxylic acid, 7-bromobenzofuran-2-carboxylic acid, 5-bromo-1-benzofurane-2-carboxylic acid, 3-bromobenzothiophene-2-carboxylic acid, 4-bromo-1-benzothiophene-2-carboxylic acid, 5-bromo-1-benzothiophene-2-carboxylic acid, 5-bromobenzo[b]thiophene-3-carboxylic acid, 6-bromo-1-benzothiophene-2-carboxylic acid, 7-bromo-1-benzothiophene-2-carboxylic acid, 5-bromo-2-benzoxazolecarboxylic acid, 3-tert-butoxy benzenecarboxylic acid, 5-tert-butyl-1,3-benzenedicarboxylic acid, 2-chlorobenzofuran-5-carboxylic acid, 3-chlorobenzofuran-5-carboxylic acid, 5-chlorobenzofuran-2-carboxylic acid, 4'-chlorobenzophenone-2-carboxylic acid, 3-chlorobenzo[b]-2-thiophenecarboxylic acid, 3-chlorobenzo[b]thiophene-2-carboxylic acid, 4-chloro-1-benzothiophene-2-carboxylic acid, 5-chloro-1-benzothiophene-2-carboxylic acid, 5-chlorobenzo[b]thiophene-3-carboxylic acid, 6-chloro-1-benzothiophene-2-carboxylic acid, 7-chloro-1-benzothiophene-2-carboxylic acid, 7-chlorobenzo[b]thiophene-2-carboxylic acid, 5-chloro-2-benzoxazolecarboxylic acid, 2-chloro-5-hydroxybenzene carboxylic acid, 2-chloro-4-morpholinobenzenecarboxylic acid, dibenzofuran-3-carboxylic acid, dibenzofuran-4-carboxylic acid, 1,4-dibenzylpiperazine-2-carboxylic acid, 3,5-dibromo-2-methoxybenzenecarboxylic acid, 2,5-difluoro-4-nitrobenzene carboxylic acid, 4,5-difluoro-2-nitrobenzenecarboxylic acid, 2,3-dihydrobenzofurane-7-carboxylic acid, 3,4-dinitro-1,2-benzenedicarboxylic acid, 4,5-dinitro-1,3-benzenedicarboxylic acid, 2,5-diphenylbenzene-1,4-dicarboxylic acid, 7-ethoxybenzofuran-2-carboxylic acid, 4-fluorobenzene-1,3-dicarboxylic acid, 6-fluoro-1,3-benzodioxene-8-carboxylic acid, 4-fluoro-1-benzothiophene-2-carboxylic acid, 5-fluoro-1-benzothiophene-2-carboxylic acid, 7-fluoro-1-benzothiophene-2-carboxylic acid, 2-fluoro-4-nitrobenzenecarboxylic acid, 3-fluoro-4-nitrobenzenecarboxylic acid, 2-hydroxybenzenecarbothioic acid, 4-hydroxy-1,2-benzene dicarboxylic acid, 5-hydroxybenzene-1,2,4-tricarboxylic acid, 4-hydroxybenzofuran-3-carboxylic acid, 4'-hydroxybenzophenone-2-carboxylic acid, 4-2-hHydroxyethoxy benzenecarboxylic acid, 3-iodobenzene-1,2-dicarboxylic acid, 4-iodo-1,2-benzenedicarboxylic acid, 4-iodo-benzo[b]thiophene-2-carboxylic acid, 4-isopentyloxy benzenecarboxylic acid, 5-methoxybenzofuran-2-carboxylic acid, 7-methoxybenzofuran-2-carboxylic acid, 2-4-methoxybenzoyl benzenecarboxylic acid, 2-methyl-1,4-benzenedicarboxylic acid, 5-methylbenzene-1,3-dicarboxylic acid, 2-methylbenzofuran-7-carboxylic acid, 3-methylbenzofuran-2-carboxylic acid, 3-methylbenzofuran-5-carboxylic acid, 6-methyl-benzofuran-2-carboxylic acid, 2-methylbenzo[b]thiophene-7-carboxylic acid, 3-methylbenzothiophene-2-carboxylic acid, 5-methyl-1-benzothiophene-2-carboxylic acid, 6-methylbenzo[b]thiophene-2-carboxylic acid, 2-methyl-5-benzoxazolecarboxylic acid, 5-morpholino-2-nitrobenzenecarboxylic acid, R—N-benzyl-piperidine-2-carboxylic acid, S—N-benzyl-piperidine-2-carboxylic acid, 3-nitro-1,2-benzenedicarboxylic acid, 4-nitro-1,3-benzenedicarboxylic acid, 1-nitrobenzene-3,4,5-tricarboxylic acid, 5-nitro-1,2,3-benzenetricarboxylic acid, 5-nitrobenzofuran-2-carboxylic acid, 5-nitro-1-benzothiophene-2-carboxylic acid, 2-4-nitrophenoxy benzenecarboxylic acid, 3-oxo-3H-benzo[f]chromene-2-carboxylic acid, 2-2-propynyloxy benzenecarboxylic acid, 4-2-pyrimidinyloxy benzenecarboxylic acid, 5-sulfo-1,2,4-benzenetricarboxylic acid, and tetrafluorobenzene-1,4-dicarboxylic acid.

In exemplary embodiments, the benzotriazole-based material includes at least one of 1-allylbenzotriazole, 1-aminobenzotriazole, 2-aminobenzotriazole, 5-aminobenzotriazole, 2-aminotriazole, aminotriazole, bemotrizinol, benthiazole, benzimidazole, 1,2-benzisothiazole, benznidazol, benzobarbital, benzoestrol, benzofuranol, benzonitrile, benzopinacol, 2-benzothiazolamine, benzothiazole, benzothiazole-d, benzothiazoline, 4-benzothiazolol, 5-benzothiazolol, 2-benzothiazolone, 1H-1,2,3-benzotriazole, 1H-benzotriazole, benzotriazole, benzotriazole-d4, benzotrichloride, benzotrifluoride, benzoxazole, benzoxazolone, benzoylmetronildazole, 2-benzoylthiazole, benzthiazuron, 4-benzylisothiazole, betazole, bismerthiazol, bisoctrizole, 5-bromobenzotriazole, bumetrizole, butyl benzotriazole, 5-carboxybenzotriazole, 1-chlorobenzotriazole, 5-chlorobenzotriazole, clotrimazole, demetridazole, dimetridazole, etisazole, etridiazole, fluotrimazole, fuberidazole, 1-hydroxybenzotriazole, 4-hydroxybenzotriazole, hydroxybenzotriazole, 2-iodobenzothiazole, labetalol, metronidazole, neticonazole, 5-nitrobenzotriazole, octrizole, 1-oxybenzotriazole, 5-methyl-1H-thiazolo[4,5-d]-1,2,3-triazole, tetrazole, tolyltriazole, triazolam, 6-chloro-1-methoxy-benzotriazole, 2,2'-[(1H-benzotriazol-1-ylmethyl)imino]bisethanol, 1H-thiazolo[4,5-d]-1,2,3-triazole, and 5-methyl-9Cl.

In exemplary embodiments, the cleaning composition may remove particles and organic contaminants, prevent corrosion of the metal wiring, and at the same time, prevent re-adsorption of the removed contaminants.

In some exemplary embodiments, the cleaning composition may further include the benzene carboxylic acid-based corrosion inhibitor or the benzotriazole-based corrosion inhibitor. Alternatively, in one exemplary embodiment, the cleaning composition may further substitute the benzene carboxylic acid-based corrosion inhibitor or the benzotriazole-based corrosion for the amino acid-based chelating agent, and accordingly, the cleaning composition may perform the function of adjusting an etch rate ("E/R") and preventing a metal corrosion.

In exemplary embodiments, the cleaning composition may remove metal contaminants by using the chelating agent and the inorganic acid, and accordingly, the removed metal contaminants combine with a buffering agent so as to form an oxygen compound or a nitrogen compound.

In exemplary embodiments, the cleaning composition may be used to remove organic or inorganic particles, as an acidic solvent having a pH of about 1 to about 6, or as an alkaline solvent having a pH of about 8 to about 13.

The organic or inorganic particles on the semiconductor apparatus are subject to van der Waals forces. Using the cleaning composition, an etching method is performed thereto along with ligand capillary phenomenon of the chelating agent. As a result, efficient removal of the organic/inorganic particles may be easily achieved by electrostatic repulsion force.

In addition, in exemplary embodiments, the cleaning composition may adjust a Cu E/R by the amount of DI water in the cleaning composition, and thereby solve problems associated with residual quantity of the materials after the cleaning process, Cu damage, and residual materials on the Cu surface.

EXAMPLE 1

A cleaning composition including 2 wt % of ethylenediaminetetraacetic acid as the amino acid-based chelating agent, 0.5 wt % of acetic acid as the organic acid, 0.2 wt % of hydrochloric acid as the inorganic acid, 3 wt % of tetramethylammonium hydroxide ("TMAH") as the alkali compound, and 94.3 wt % of DI water ("DIW") was prepared.

Next, the prepared cleaning composition was diluted 20-fold with DI Water, and the cleaning function thereof was evaluated with respect to the glass substrate 100 and the second Cu conductive layer 124a of FIG. 1.

In addition, a cleaning composition including 99.5 wt % of DI water and 0.5 wt % of TMAH and a cleaning composition including only DI Water were each tested for comparison, and the results are shown in Table 1 below.

TABLE 1

|  | DIW | 0.5 wt % of TMAH | Cleaning composition (20-fold dilution) |
|---|---|---|---|
| Wet-ability | ○ | X | ○ |
| Spread-ability (millimeters: mm) | 4.0 mm | 8.0 mm | 7.0 mm |
| Foam & De-foam | ◉ | ○ | ◉ |
| Particle removal and re-adsorption of the removed particle | Δ | Δ | ◉ |
| Cu damage and Cu corrosion | No Cu corrosion | Cu corrosion | No Cu corrosion |
| Organic dust removability | ○ | ○ | ◉ |
| Metal dust removability | Δ | ◉ | ◉ |

◉: Excellent,
○: Good,
Δ: Not Bad,
X: Bad

Referring to Table 1 above, it was confirmed that the cleaning composition of Example 1 has improved the Cu corrosion prevention ability, the removability of particles and the re-adsorption capacity of the removed particles.

EXAMPLE 2

The cleaning composition of Example 1 including 2 wt % of ethylenediaminetetraacetic acid as the amino acid-based chelating agent, 0.5 wt % of acetic acid as the organic acid, 0.2 wt % of hydrochloric acid as the inorganic acid, 3 wt % of TMAH as the alkali compound, and 94.3 wt % of DI water was prepared. Then, the cleaning composition was diluted 2-fold (1:1), 4-fold (4:1), 9-fold (9:1), and 14-fold (14:1) with DI water, and evaluated in terms of an E/R per dilution ratio, a pH of the materials, and particle count ("P/C").

In addition, a cleaning composition including 99.6 wt % of DI water and 0.4 wt % of TMAH and a cleaning composition including only DI Water were each tested for the comparison, and the results are shown in Table 2 below.

TABLE 2

|  | E/R (Angstroms per minute (Å/min)) | pH | Particle removal efficiency (%) |
|---|---|---|---|
| 1:1 | 4.73 | 9.93 | 95 |
| 4:1 | 2.38 | 10.01 | 90 |
| 9:1 | 1.59 | 10.15 | 90 |
| 14:1 | 1.46 | 10.16 | 80 |
| 0.4 wt % of TMAH | 1.86 | 12.52 | 75 |
| DIW | 1.19 | 6.23 | 20 |

Referring to Table 2 above, it was confirmed that the cleaning composition according to an embodiment of the present invention had high particle removal efficiency compared to the cleaning composition including only 0.4% of TMAH or only DI Water.

Also, it was confirmed that the exemplary cleaning composition may control the E/R according to the degree of the dilution of the cleaning composition with DI Water.

EXAMPLE 3

The cleaning composition of Example 1 including 2 wt % of ethylenediaminetetraacetic acid as the amino acid-based chelating agent, 0.5 wt % of acetic acid as the organic acid, 0.2 wt % of hydrochloric acid as the inorganic acid, 3 wt % of TMAH as the alkali compound, and 94.3 wt % of DI water was prepared. Then, the cleaning composition was diluted 14-fold (14:1) with DI water, and evaluated by measuring the number of glass particles during a demonstration process. In addition, for comparison evaluation, the cleaning composition including only DI water was tested for the comparison.

The demonstration process was performed by the sequence of: chemical treatment→cleaning→cleaning→cleaning, and the number of the glass particles was measured for the comparison evaluation. The results are shown in Table 3 below.

TABLE 3

|  | Number of particles before a cleaning process | Number of particles after a cleaning process | Difference in number of particles | Particle removal efficiency (%) |
|---|---|---|---|---|
| DIW | 339 | 992 | 653 particles increase | 192% |

TABLE 3-continued

| | Number of particles before a cleaning process | Number of particles after a cleaning process | Difference in number of particles | Particle removal efficiency (%) |
|---|---|---|---|---|
| 20-fold dilution | 269 | 30 | 239 particles decrease | 88.8% |
| 14-fold dilution | 394 | 35 | 359 particles decrease | 91.1% |

Referring to Table 3 above, it was confirmed that the cleaning composition including only DI water increased the number of particles after the washing process. Meanwhile, it was confirmed that the exemplary cleaning composition controls the E/R according to the degree of the dilution with DI water (refer to Table 2 above), and the particle removal efficiency was higher than 88%.

Therefore, the exemplary cleaning composition determines the E/R of the processes according to the degree of the dilution of the cleaning composition, and accordingly, prevents occurrence of spotting defects of fine line width in many places by removing the particles after the washing process.

EXAMPLE 4

The cleaning composition of Example 1 including 2 wt % of ethylenediaminetetraacetic acid as the amino acid-based chelating agent, 0.5 wt % of acetic acid as the organic acid, 0.2 wt % of hydrochloric acid as the inorganic acid, 3 wt % of TMAH as the alkali compound, and 94.3 wt % of DI water was prepared. Then, the cleaning composition was diluted 20-fold (20:1) with DI water, and a Cu dissolution test was conducted using Inductively Coupled Plasma-Atomic Emission Spectrometry ("ICP-AES") for the comparison evaluation.

Also, for comparison, the following cleaning compositions were evaluated: (1) a cleaning composition including 3 wt % of hydrochloric acid and 91.5 wt % of DWI, (2) a cleaning composition including only DI Water, and (3) a cleaning composition including 99 wt % of DI Water and 10 wt % of TMAH. The results are shown in Table 4 below.

TABLE 4

| | Cu elution time | | |
|---|---|---|---|
| | 5 minutes (parts per billion (ppb)) | 15 minutes (ppb) | 30 minutes (ppb) |
| DIW | 0.114 | 0.204 | 0.512 |
| 20-fold dilution | 0.080 | 0.102 | 0.412 |
| 10 wt % of TMAH (pH = 13.25) | 0.442 | 0.890 | 2.002 |
| 3 wt % of inorganic acid (pH = 0.3) | 0.160 | 0.436 | 0.788 |

Referring to Table 4 above, it was showing that if the cleaning composition had a pH of 8 or less, copper that has been eluted was re-adsorbed, and thus the elution amount was increased by a small amount. On the contrary, it was shown that if the cleaning composition had a pH of 13 or greater, copper that has been eluted was corroded into $HCuO_2^-$, and thus the elution amount was increased by a significantly large amount.

EXAMPLE 5

The cleaning composition of Example 1 including 2 wt % of ethylenediaminetetraacetic acid as the amino acid-based chelating agent, 0.5 wt % of acetic acid as the organic acid, 0.2 wt % of hydrochloric acid as the inorganic acid, 3 wt % of TMAH as the alkali compound, 94.3 wt % DI water was prepared.

Next, the cleaning composition was diluted 20-fold with DI water, and the cleaning function thereof was evaluated with respect to the glass substrate 100 and the second Cu conductive layer 124a of FIG. 1.

A cleaning composition including 0.1 wt % of 6-chloro-1-methoxy-benzotriazole, 0.5 wt % of acetic acid, 0.2 wt % of hydrochloric acid, 3 wt % of TMAH, and 96.2 wt % of DI water was prepared, where the benzotriazole-based corrosion inhibitor was substituted for the amino acid-based chelating agent. Then, the cleaning composition was diluted 20-fold, and the cleaning performance thereof was evaluated.

A cleaning composition including 2 wt % of ethylenediaminetetraacetic acid as the amino acid-based chelating agent, 0.5 wt % of acetic acid as the organic acid, 0.2 wt % of hydrochloric acid as the inorganic acid, 3 wt % of TMAH as the alkali compound, 94.2 wt % of DI Water was added to 0.1 wt % of 6-chloro-1-methoxy-benzotriazole as the corrosion inhibitor, thereby completing preparation of the cleaning composition. Then, the cleaning composition was diluted 20-fold, and the cleaning performance thereof was evaluated.

A cleaning composition including 2 wt % of ethylenediaminetetraacetic acid as the amino acid-based chelating agent, 0.5 wt % of acetic acid as the organic acid, 0.2 wt % of hydrochloric acid as the inorganic acid, 3 wt % of TMAH as the alkali compound, 94.2 wt % DI water was added to 0.1 wt % of 6-chloro-1-methoxy-benzotriazole as the corrosion inhibitor, thereby completing preparation of the cleaning composition. Then, the cleaning composition was diluted 20-fold, and the cleaning performance thereof was evaluated.

A cleaning composition including 2 wt % of ethylenediaminetetraacetic acid as the amino acid-based chelating agent, 0.5 wt % of acetic acid as the organic acid, 0.2 wt % of hydrochloric acid as the inorganic acid, 3 wt % of TMAH as the alkali compound, 94.1 wt % of DI water was added to 0.2 wt % of 6-chloro-1-methoxy-benzotriazole as the corrosion inhibitor, thereby completing preparation of the cleaning composition. Then, the cleaning composition was diluted 20-fold, and the cleaning performance thereof was evaluated. The results are shown in Table 5 below.

TABLE 5

| | E/R (Å/min) | Corrosion prevention |
|---|---|---|
| 20-fold dilution | 5.426 | ◎ |
| Substitution of a corrosion inhibitor for the amino acid-based chelating agent, followed by 20-fold dilution | 6.502 | ○ |
| Addition of 0.1 wt % of 6-chloro-1-methoxy-benzotriazole | 9.503 | ◎ |
| Addition of 0.2 wt % of 6-chloro-1-methoxy-benzotriazole | 6.239 | ◎ |

◎: Excellent,
○: Good,
Δ: Not Bad,
X: Bad

Referring to Table 5 above, it was shown that when the corrosion inhibitor was added to the cleaning composition, the cleaning composition had excellent corrosion prevention performance. Also, it was shown that the cleaning composition may control the E/R by adjusting the composition of the corrosion inhibitor that was added thereto.

In addition, it was confirmed that when the corrosion inhibitor was substituted for the amino acid-based chelating agent, the cleaning composition had excellent performance of corrosion prevention.

EXAMPLE 6

A Ti/Cu layer was formed on a glass substrate, and subjected to a washing process. Then, the particle removal efficiency of the following cleaning composition was compared.

A cleaning composition including 0.2 wt % of ethylenediaminetetraacetic acid as the amino acid-based chelating agent, 0.04 wt % of acetic acid as the organic acid, 0.02 wt % of nitric acid as the inorganic acid, 0.32 wt % of TMAH as the alkali compound, and 99.42 wt % of DI water was prepared (Composition 1).

Then, the cleaning composition (Composition 1) was diluted 2-fold and 10-fold (dilution of Composition 1).

Also, a cleaning composition including 4 wt % of ethylenediaminetetraacetic acid as the amino acid-based chelating agent, 1 wt % of acetic acid as the organic acid, 0.44 wt % of nitric acid as the inorganic acid, 3.5 wt % of TMAH as the alkali compound, and 91.06 wt % of DI water was prepared (Composition 2).

Then, the cleaning composition (Composition 2) was diluted 2-fold and 10-fold (dilution of Composition 2).

In addition, a cleaning composition including only DI water was tested for the comparison, and the results are shown in Table 6 below.

TABLE 6

| Cleaner | pH | Dilution ratio | Defect Size | Total | Large | Medium | Small |
| --- | --- | --- | --- | --- | --- | --- | --- |
| DIW | 7.0 | — | Before Cleaning | 414 | 133 | 74 | 207 |
|  |  |  | After cleaning | 691 | 54 | 78 | 560 |
|  |  |  | Removal rate | −67% | 60% | −5% | −171% |
| Composition 1 | 9.8 | Original solution | Before Cleaning | 272 | 64 | 41 | 167 |
|  |  |  | After cleaning | 260 | 35 | 37 | 188 |
|  |  |  | Removal rate | 4% | 45% | 9% | −13% |
|  | 10.2 | 7:1 | Before Cleaning | 315 | 85 | 53 | 177 |
|  |  |  | After cleaning | 260 | 22 | 47 | 191 |
|  |  |  | Removal rate | 17% | 74% | 13% | −8% |
|  | 10.2 | 9:1 | Before Cleaning | 410 | 113 | 80 | 217 |
|  |  |  | After cleaning | 329 | 36 | 69 | 223 |
|  |  |  | Removal rate | 20% | 68% | 14% | −3% |
| Composition 2 | 4.2 | 1:1 | Before Cleaning | 465 | 151 | 72 | 242 |
|  |  |  | After cleaning | 325 | 48 | 50 | 226 |
|  |  |  | Removal rate | 30% | 68% | 31% | 6% |
|  | 4.2 | 9:1 | Before Cleaning | 470 | 136 | 79 | 255 |
|  |  |  | After cleaning | 329 | 49 | 56 | 224 |
|  |  |  | Removal rate | 30% | 64% | 29% | 12% |

Referring to Table 6 above, it was shown that, regardless of a pH value, the exemplary cleaning compositions (Composition 1 and Composition 2) had high particle removal efficiency. Also, it was confirmed that when the cleaning compositions (Composition 1 and Composition 2) were diluted, the cleaning compositions had excellent cleaning capability.

EXAMPLE 7

Figure 5:
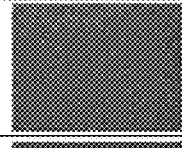
FIG. 5 is a scanning electron microscope ("SEM") image showing changes on a copper (Cu) surface in accordance with Example 7 of the present invention.
Figure 5:
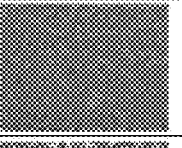
Figure 5:
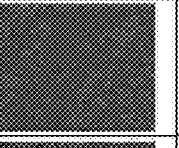
Figure 5:
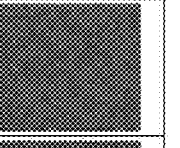
Figure 5:
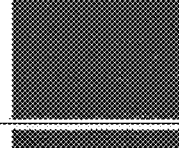
Figure 5:
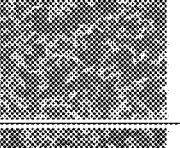
Figure 5:
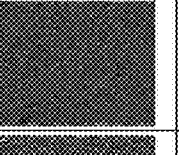
Figure 5:
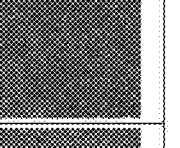
Figure 5:
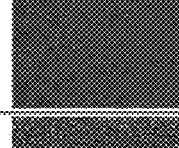
Figure 5:
Figure 5:
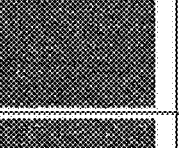
Figure 5:
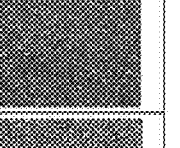
Figure 5:
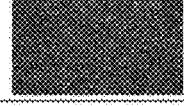
Figure 5:
Figure 5:
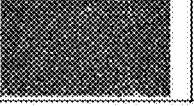
Figure 5:
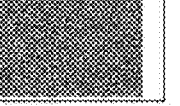

A Ti/Cu layer was formed on a glass substrate, and subjected to a dipping process with the cleaning composition described below. Then, the surface changes over time were observed using a scanning electron microscope (SEM). FIG. 5 is a SEM image showing changes on the Cu surface in accordance with Example 7.

The cleaning composition (Composition 2) of Example 6 was prepared and then diluted 10-fold (dilution of Composition 2).

In addition, for the comparison evaluation, a cleaning composition including only DI water and a cleaning composition including 99.6 wt % of DI water and 0.4 wt % of TMAH were each tested for the comparison.

Referring to FIG. 5, it was shown that the cleaning composition including only DI water and the cleaning compositions (Composition 2 and dilution of Composition 2) of Example 7 had no corrosion on the Cu surface, but the cleaning composition including 0.4 wt % of TMAH had corrosion on the Cu surface.

EXAMPLE 8

Figure 6:
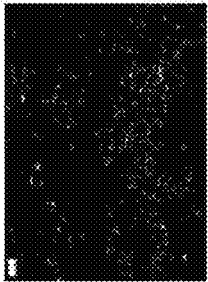
FIG. 6 is a SEM image showing changes on a Cu surface when $Fe_2O_3$ is spread on a substrate in accordance with Example 8.
Figure 6:
Figure 6:
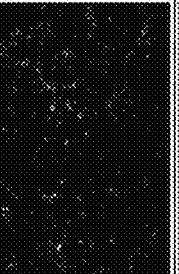
Figure 6:
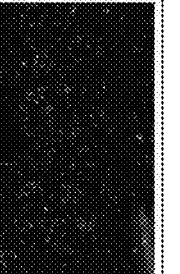
Figure 6:
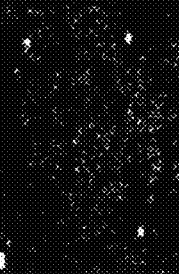
Figure 6:
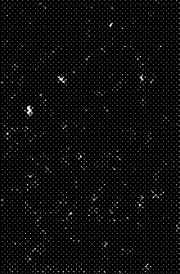
Figure 6:
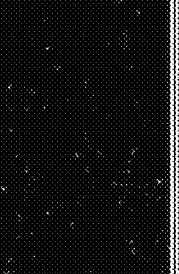
Figure 6:
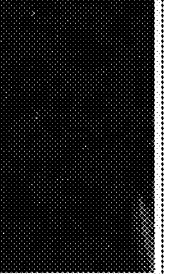
Figure 8:
FIG. 8 is a SEM image showing changes on a Cu surface when erucamide is spread on a substrate in accordance with Example 8.
Figure 9:
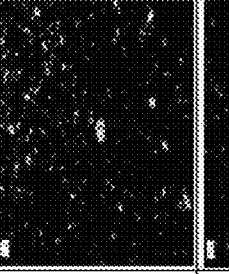
FIG. 9 is a SEM image showing changes on a Cu surface when a glass chip is spread on a substrate in accordance with Example 8.

$Fe_2O_3$, oil, and erucamide were each spread on the glass substrate having the Ti/Cu layer, and accordingly, the particle removal efficiency of cleaning compositions was evaluated. FIG. 6 is a SEM image showing changes on the Cu surface when $Fe_2O_3$ was spread on the substrate in accordance with Example 8, FIG. 7 is a SEM image showing changes on the Cu surface when oil was spread on the substrate in accordance with Example 8, and FIG. 8 is a SEM image showing changes on the Cu surface when erucamide was spread on the substrate in accordance with Example 8. FIG. 9 is a SEM image showing changes on the Cu surface when a glass chip was spread on the substrate in accordance with Example 8.

The cleaning compositions (Composition 1 and Composition 2) of Example 6 were prepared.

In addition, a cleaning composition including only DI water and a cleaning composition including 99.6 wt % of DI water and 0.4 wt % of TMAH were each tested for the comparison.

Referring to FIGS. 6 to 9, it was shown that the exemplary cleaning compositions (Composition 1 and Composition 2) had excellent particle removal efficiency on the Cu surface.

As described above, in exemplary embodiments, a cleaning composition may prevent corrosion of a metal wiring and remove contaminants.

It should be understood that the exemplary embodiments described therein should be considered in a descriptive sense only and not for purposes of limitation. The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims

What is claimed is:

1. A cleaning composition consisting of:
about 0.01 to about 5 wt % of a chelating agent, wherein the chelating agent comprises an amino acid compound;
about 0.01 to about 0.5 wt % of an organic acid;
about 0.01 to about 1.0 wt % of an inorganic acid;
about 0.01 to about 5 wt % of an alkali compound;
optionally, a corrosion inhibitor; and
deionized water.

2. The cleaning composition according to claim 1, wherein the amino acid compound comprises at least one of glycine, ethylenediaminetetraacetic acid, and cyclohexanediaminetetraacetic acid.

3. The cleaning composition according to claim 1, wherein the organic acid comprises at least one of lactic acid, lactic acid alkyl ester, acetic acid, and acetic acid alkyl ester.

4. The cleaning composition according to claim 1, wherein the inorganic acid comprises at least one of hydrochloric acid, phosphoric acid, nitric acid, sulfuric acid, hydrofluoric acid, bromic acid, and iodic acid.

5. The cleaning composition according to claim 1, wherein the alkali compound comprises at least one of tetramethylammonium hydroxide, tetrabutylammonium hydroxide, tetraethylammonium hydroxide, and trimethylammonium chloride.

6. The cleaning composition according to claim 1, wherein the cleaning composition has a pH of about 1 to about 6.

7. The cleaning composition according to claim 1, wherein the cleaning composition has a pH of about 8 to about 13.

8. The cleaning composition according to claim 1, wherein the corrosion inhibitor is in an amount of about 0.01 to about 3 wt %.

9. The cleaning composition according to claim 8, wherein the corrosion inhibitor comprises a benzene carboxylic acid-based material or a benzotriazole-based material.

10. A cleaning composition comprising:
about 0.01 to about 3 wt % of a corrosion inhibitor, wherein the corrosion inhibitor comprises 6-chloro-1-methoxybenzotriazole
about 0.01 to about 0.5 wt % of an organic acid;
about 0.01 to about 1.0 wt % of an inorganic acid;
about 0.01 to about 5 wt % of an alkali compound; and
deionized water.

11. A method of manufacturing a metal wiring, the method comprising:
forming a first conductive layer on a substrate;
forming a second conductive layer on the first conductive layer;
cleaning the second conductive layer using a cleaning composition;
forming a photoresist layer pattern on the second conductive layer, and
etching the first conductive layer and the second conductive layer,
wherein the cleaning composition consists of:
about 0.01 to about 5 wt % of a chelating agent, wherein the chelating agent is an amino acid compound;
about 0.01 to about 0.5 wt % of an organic acid;
about 0.01 to about 1.0 wt % of an inorganic acid;
about 0.01 to about 5 wt % of an alkali compound;
optionally, a corrosion inhibitor; and
deionized water.

12. The method according to claim 11, wherein the amino acid compound comprises at least one of glycine, ethylenediaminetetraacetic acid, and cyclohexanediaminetetraacetic acid.

13. The method according to claim 11, wherein the organic acid is at least one selected from lactic acid, lactic acid alkyl ester, acetic acid, and acetic acid alkyl ester.

14. The method according to claim 11, wherein the inorganic acid comprises at least one of hydrochloric acid, phosphoric acid, nitric acid, sulfuric acid, hydrofluoric acid, bromic acid, and iodic acid.

15. The method according to claim 11, wherein the alkali compound acid comprises at least one of tetramethylammonium hydroxide, tetrabutylammonium hydroxide, tetraethylammonium hydroxide, and trimethylammonium chloride.

16. The method according to claim 11, wherein the corrosion inhibitor is present in an amount of about 0.01 to about 3 wt % of a corrosion inhibitor.

17. The method according to claim 11, wherein the corrosion inhibitor comprises a benzene carboxylic acid-based material or a benzotriazole-based material.

18. The method according to claim 11, wherein the substrate is formed of glass, the first conductive layer is formed of titanium (Ti), and the second conductive layer is formed of copper (Cu).

* * * * *